United States Patent [19]

Shirai et al.

[11] Patent Number: 4,628,616
[45] Date of Patent: Dec. 16, 1986

[54] VAPOR TANK

[75] Inventors: Mitugu Shirai; Hideaki Sasaki, both of Hadano; Sadatoshi Ueda, Chiba; Akira Sawada, Fujisawa, all of Japan

[73] Assignees: Hitachi, Ltd.; Hitachi Sanki Engineering Co., Ltd., both of Tokyo, Japan

[21] Appl. No.: 671,872

[22] Filed: Nov. 15, 1984

[30] Foreign Application Priority Data

Nov. 16, 1983 [JP] Japan ................................ 58-213945

[51] Int. Cl.[4] ............................................. F26B 19/00
[52] U.S. Cl. ........................................ 34/78; 34/231; 134/11; 134/31; 165/908; 432/194; 432/197
[58] Field of Search ............... 34/68, 73, 78, 226, 34/231, 36; 68/5 D, 5 E, 18 C; 118/61, 64; 134/11, 31, 105, 109, 122 R, 122 P; 165/DIG. 10, DIG. 11; 202/170; 228/240, 242; 432/90, 91, 185, 194, 197

[56] References Cited

U.S. PATENT DOCUMENTS

| | | | |
|---|---|---|---|
| 3,227,629 | 1/1966 | Kearney | 134/60 |
| 3,460,990 | 8/1969 | Barday | 134/11 |
| 4,029,517 | 6/1977 | Rand | 68/186 |
| 4,389,797 | 6/1983 | Spigarelli et al. | 118/733 |

FOREIGN PATENT DOCUMENTS 23107  1/1981  European Pat. Off. .

OTHER PUBLICATIONS

"In-Line Vapor Phase Soldering", in Packaging and Production, Nov. 1982, pp. 62-67.

Primary Examiner—Albert J. Makay
Assistant Examiner—David W. Westphal
Attorney, Agent, or Firm—Antonelli, Terry & Wands

[57] ABSTRACT

A vapor tank for processing a product by heating the same through exposure to vapor serving as a heat transfer medium. The vapor tank includes at least one partition wall separating a vapor chamber filled with vapor and a heating chamber for processing the product by heating the same for supplying a sufficient saturated vapor to the product. The partition wall is formed with openings for allowing the saturated vapor to be injected therethrough from the vapor chamber into the heating chamber where the product is enveloped by the saturated vapor. The vapor tank is provided with a recovery device for recovering the vapor flowing out of the tank through an inlet and an outlet for introducing and discharging the product into and out of the tank with a high degree of vapor recovering efficiency and with a minimum loss of energy. The vapor tank is also provided with a mechanism for externally supplying air currents to prevent the vapor from flowing out of the tank through the inlet and the outlet.

7 Claims, 13 Drawing Figures

VAPOR TANK

BACKGROUND OF THE INVENTION

This invention relates to a vapor tank using vapor as a heat transfer medium to heat the product to be processed.

Vapor phase systems have been developed which use vapor as a heat transfer medium and utilize its thermal energy to heat the product to be processed. For example, in one of those systems, a vapor tank generally referred to as a vapor reflow tank is used wherein an electronic component is mounted on a soldering pattern of a printed circuit board and the printed circuit board is passed through a vapor phase to heat and melt the solder to thereby achieve vapor phase soldering of the electronic component onto the printed circuit board. In the other of those systems, a vapor tank is also used for performing heating to cause a resinous material to set, and a vapor tank for effecting fluxless fusing of solder plating on a printed circuit board.

Several well-known types of vapor tank will be outlined. One of them has a vapor generating section located separately from the vapor tank for generating vapor which is introduced into the vapor tank through an upper portion thereof. The vapor tank is formed with an inlet and an outlet at its side wall. A conveyor or other conveying means is provided for conveying the product to be processed into and out of the vapor tank where the product is heated by the vapor enveloping it before being released from the vapor tank. This type of vapor tank, which suits applications using vapor of high specific gravity with respect to air, has been in use.

When the product is heated by vapor, it is necessary that the product be enveloped sufficiently by the vapor and it is essential that the time required for heating be minimized to avoid deterioration of the product while enabling thermal energy to be provided in an amount large enough to accomplish the object. To this end, it is desirable that the vapor for enveloping the product be saturated vapor.

The vapor tank of the type outlined hereinabove suffers the disadvantage that the vapor phase formed around the product is prevented from becoming saturated vapor by the fact that the vapor is diffused or air is drawn into the vapor due to a local turbulence of the vapor. It has been ascertained with regard to water vapor that the heat transfer speed of unsaturated vapor with respect to the product to be processed is lower by 30–50% than saturated vapor when the proportion of air entrained by the vapor is 2%. Owing to the fact that the vapor phase enveloping the product is not saturated vapor, this type of vapor tank has had many problems. More specifically, the heat transfer speed is low and the temperature of the product is prevented from rising to a predetermined level. If heating is continued until the temperature of the product reaches the predtermined level, then the time required for attaining the end is too long to avoid deterioration of the product which is not desirable. Particularly, the air tends to remain on the underside of the product, resulting in a rise in temperature becoming unsatisfactory.

Meanwhile, another type of vapor tank has a vapor generating section located inside the tank. This type of vapor tank is disclosed in the article entitled "In-line Vapor Phase Soldering" appearing in "ELECTRONIC PACKAGING and PRODUCTION", November 1982. In this tank, a liquid stored in a lower portion of the tank is heated by heaters to generate vapor which envelops the product to be processed, to heat the same. This type of tank also has to have openings for conveying the product into and out of the tank, and the vapor tends to flow out of the tank through these openings. Thus, to form and maintain a saturated vapor phase for enveloping the product requires an overwhelmingly larger amount of heat for generating vapor than for heating the product by the generated heat, so that this system is uneconomical.

The foregoing description refers to problems with regard to the vapor tanks for supplying vapor to the product to be processed. Another problem that has to be solved with regard to the vapor is how to recover the vapor that has been used. The vapor used in the vapor tanks described hereinabove has a molecular weight which is about 820 gram/mol at applied temperature and pressure, so that its specific gravity with respect to air is about twenty-fold. Such heat transfer medium is very expensive and it has hitherto been usual practice to use a recovery device for recovering the used vapor for reuse.

A recovery device for recovering used vapor popularly used comprises condensers located beneath passages providing an inlet and an outlet to the vapor tank for liquefying the vapor that flows out of the tank. The condenser is a device having built-in cooling tubes for cooling the vapor into a condensate, and communication tubes for returning the condensate to the lower portion of the vapor tank.

The vapor introduced into the condenser through an upper portion thereof is first brought into contact with the cooling tubes in the upper portion of the condenser and then falls by its own weight, so that it is brought into contact with one cooling tube after another until it reaches the bottom of the condenser. While the vapor falls in the condenser as described hereinabove, it is cooled and turned to a condensate which collects on the bottom of the condenser. At this time, the temperature distribution of the vapor or condensate is such that the temperature is high in the upper portion of the condenser and low in the lower portion thereof. That is, the vapor is high in concentration in the upper portion of the condenser and low in the lower portion thereof. Thus, the vapor near the upper portion of the condenser is high in temperature and concentration, so that the vapor recovering efficiency is low. Also, the temperature of the condensate progressively falls as it drops from the cooling tubes in the upper portion of the condenser to those in the lower portion thereof, and the condensate initially standing at 215° C. is sometimes cooled such that its temperature is close to that of cooling water flowing through the cooling tubes when it reaches the bottom of the condenser. The condensate thus produced is returned through the communication tubes to the lower portion of the vapor tank to be revaporized. To achieve revaporization of the condensate would require not only sensible heat produced by the heaters for heating the liquid to its boiling point but also latent heat for vaporizing the liquid at its boiling point. In other words, the condensate overcooled by the condenser would require sensible heat for heating the liquid to its boiling point by the heaters. Thus, the amount of heat generated by the heaters would be wasted.

Another problem raised in this type of vapor tank is that when the product that has been processed in the vapor tank is conveyed from the tank to outside through the outlet passage, the vapor would be formed into frost on the surface of the product and the expensive liquid would be released to outside without being recovered if the temperature of the product fell below the dew point of the vapor in the outlet passage.

SUMMARY OF THE INVENTION

This invention has as its object the provision of a vapor tank which obviates the above-noted problems of the prior art.

Accordingly, one of the objects of the invention is to provide a vapor tank capable of economically providing sufficient saturated vapor for processing the product by a vapor phase process.

To accomplish the above-mentioned object, the invention provides a vapor tank for processing a product by heating the same through exposure to vapor, comprising a vapor chamber located in a lower portion of the tank and filled with vapor, a heating chamber for processing the product by heating the same, and a partition wall separating the heating chamber and the vapor chamber from each other and formed with openings for allowing the vapor in the vapor chamber to be injected therethrough from the lower portion of the tank toward the heating chamber to impinge against the product located in the heating chamber.

Another object is to provide a vapor tank of the type described capable of supplying saturated vapor in an amount large enough to process the product which is relatively large in width, depth and/or height.

To accomplish the above-mentioned object, the vapor tank for processing a product by heating the same through exposure to vapor may comprise, in addition to the lower vapor chamber, a second vapor chamber located in an upper portion of the tank, and a second partition wall separating the second vapor chamber and heating chamber from each other and formed with openings for allowing the vapor in the second vapor chamber to be injected therethrough from the upper portion of the tank toward the heating chamber whereby the vapor can be injected from above and below to impinge against the product to be processed.

Still another object is to provide a vapor tank of the type described capable of injecting vapor of high specific gravity with respect to air in substantially equal amounts through the openigns formed in the upper and lower partition walls into the heated chamber.

To accomplish this object, the vapor tank for processing a product by heating the same through exposure to vapor which is provided with the upper and lower partition walls may be constructed such that the openings formed in the upper partition wall have a mean area larger than the mean area of the openings formed in the lower partition wall. The area of the openings formed in the upper partition wall may be larger in the openings located in a central portion of the upper partition wall than in the openings located in a peripheral pertion thereof whereby the amounts of vapor injected through the openings formed in the upper partition wall can be substantially equalized.

Still another object is to provide a vapor tank of the type described capable of controlling the vapor injected through the openings formed in the upper and lower partition walls into the heating chamber in accordance with the dimensions of the product to be processed.

To accomplish the above-mentioned object, the vapor tank for processing a product by heating the same through exposure to vapor which is provided with the upper and lower partition walls may be constructed such that the lower partition wall is formed in a portion thereof with adjustable exhaust means whereby when the exhaust means is opened, the vapor is mainly injected through the openings formed in the lower partition wall and when the exhaust means is closed, the vapor is injected both through the openings formed in the lower partition wall and through the openings formed in the upper partition wall.

Still another object is to provide a vapor tank of the type described capable of recovering the vapor that has been used with a high degree of vapor recovering efficiency and with a minimum of energy loss.

To accomplish the above-mentioned object, the vapor tank for processing a product by heating the same through exposure to vapor may further comprise recovery means located beneath passages through which the product is brought into and out of the vapor tank for recovering the vapor of high specific gravity with respect to air by cooling the vapor with a group of cooling tubes, the recovery means including a first space located in the vicinity of the vapor tank for allowing the vapor flowing out of the tank to flow downwardly, and a second space located in the vicinity of a bottom portion thereof for collecting the vapor that has flowed downwardly, said groups of cooling tubes being located above the second space for cooling the vapor. The vapor tank may comprise recovery means located beneath passages through which the product is brought into and out of the vapor tank for recovering the vapor of high specific gravity with respect to air, said recovery means including a vapor box for allowing the vapor flowing out of the vapor tank to fall by its own weight and collected therein while separating air from the vapor, and means for accelerating a flow of vapor for returning the vapor collected in the vapor box through a communication tube to the vapor tank.

A further object is to provide a vapor tank of the type described capable of avoiding outflow of the vapor from the vapor tank.

To accomplish the above-mentioned object, the vapor tank for processing a product by heating the same through exposure to vapor may further comprise a first tunnel extending substantially horizontally and providing an inlet and an outlet for introducing and discharging the product into and out of the tank, second tunnel branching from upper portion of the first tunnel and extending therefrom obliquely upwardly toward the vapor tank, and means for supplying air directed to flow from the first tunnel toward the second tunnel to prevent the vapor in the vapor tank from flowing into the first tunnel.

DESCRIPTION OF THE PREFERRED EMBODIMENT

Figure 1:
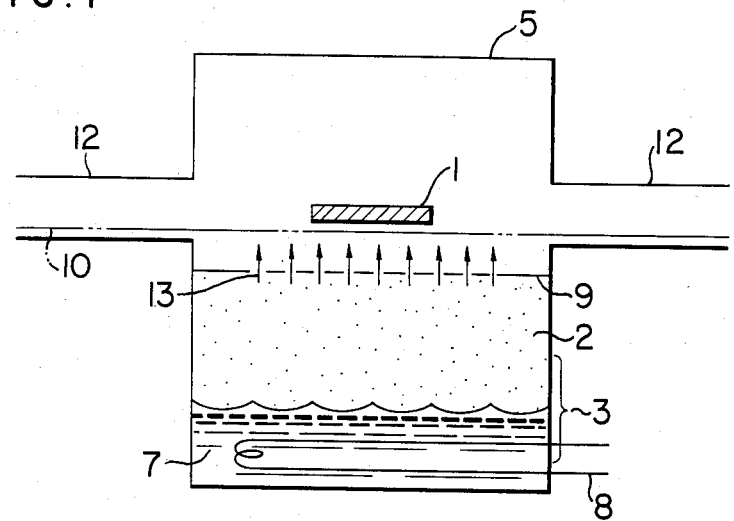
FIG. 1 is a schematic vertical sectional view of the vapor tank comprising one embodiment of the invention.

Preferred embodiments of the invention will be described by referring to the drawings. A first embodiment which is capable of supplying saturated vapor to the product to be processed is shown in FIG. 1.

FIG. 1 is a schematic vertical sectional view of the vapor tank 5 according to the invention having a processing fluid 7 stored in a lower portion thereof and heated by heaters 8 to generate vapor 2 used to heat a product 1 to be processed. Inlet and outlet passages 12 are provided to the tank 5 for introducing the product 1 into and out of the vapor tank 5 by means of a conveyor 10. The feature which distinguishes the vapor tank 5 from the corresponding part of the prior art is the provision of a partition plate 9.

The partition plate 9 which is formed with a plurality of openings 13 is located above a vapor generating section 3 in the vapor tank 5 and close to the product 1 to be processed to divide the interior of the vapor tank 5 into a vapor generating zone (first space or vapor chamber) and a processing zone (second space or heating chamber). The partition plate 9 is formed of high heat resisting material, such as stainless steel, and has a small thickness as far as the withstanding pressure of the vapor allows to reduce the thermal capacity of the plate 9.

As the processing fluid 7 is heated by the heaters 8 and the vapor 2 is generated, air in the vapor generating section 3 is discharged through the openings 13 in the partition plate 9 to flow upwardly to allow the vapor in the vapor generating zone below the partition plate 9 to become saturated. At this time, the vapor 2 flowing toward the processing zone is injected through the openings 13 into the processing zone. Stated differently, the vapor 2 is accelerated in its flow as compared with vapor in a vapor tank of the prior art which is not accelerated.

Figure 2:
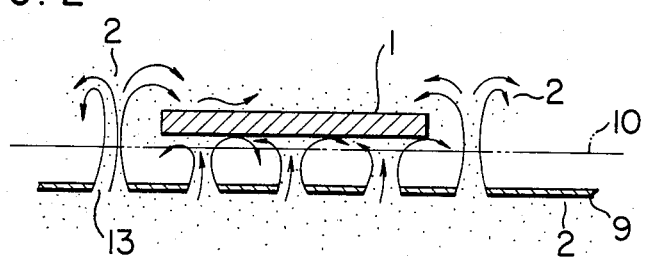
FIG. 2 is a schematic view showing the manner in which the vapor is injected through the openings formed in the partition plate into the processing zone in the vapor tank shown in FIG. 1.

FIG. 2 shows the manner in which the vapor 2 is injected through the openings 13 into the processing zone in the vapor tank 5 shown in FIG. 1. The vapor 2 accelerated by the openings 13 formed in the partition plate 9 is injected upwardly into the processing zone where it impinges against the product 1 to be processed while in a saturated state. Meanwhile, the vapor 2 which does not impinge against the product 1 continuously flows over the product 1 as it flows in its vicinity, with the result that the product 1 is enveloped by a vapor film formed thereon. Thus, the temperature of the product 1 as a whole rises and a top surface of the product 1 can be processed by heating through contact with the vapor 2.

By causing the vapor 2 to be injected through the openings 13, the velocity of the currents of vapor increases. However, since the vapor 2 may flow in turbulence, the vapor 2 might appear to mingle with air. However, in the vapor tank 5 according to the invention, the vapor 2 injected through the openings 13 and impinging against the product 1 is positively in a saturated state without being unsaturated by an admixture of air by virtue of the following features. One of them is that the partition plate 9 is located in close proximity to the product 1 to be processed, and another feature is that the openings 13 each have a large diameter to increase the diameter of each current of vapor 2 injected therethrough. Depending on the dimensions of the product 1, the partition plate 9 may be formed with only one opening in place of the plurality of openings 13. However, the plurality of openings 13 may be formed so long as it is ascertained that the vapor 2 flows substantially horizontally along the product 1 to form a saturated vapor phase on the surface of the product 1 after it is injected through the openings into the processing zone and before it has provided the product 1 with its thermal energy and flows downwardly.

To minimize the amount of vapor 2 flowing out of the vapor tank 5 to outside, the openings 13 may be advantageously located in a larger number in a central portion of the partition plate 9 than in a peripheral portion to perform processing of the product 1 in a central portion of the vapor tank 5 to thereby avoid the vapor being injected through portions of the partition plate 9 near inlet and outlet passages 12 of the vapor tank 5.

Figure 3:
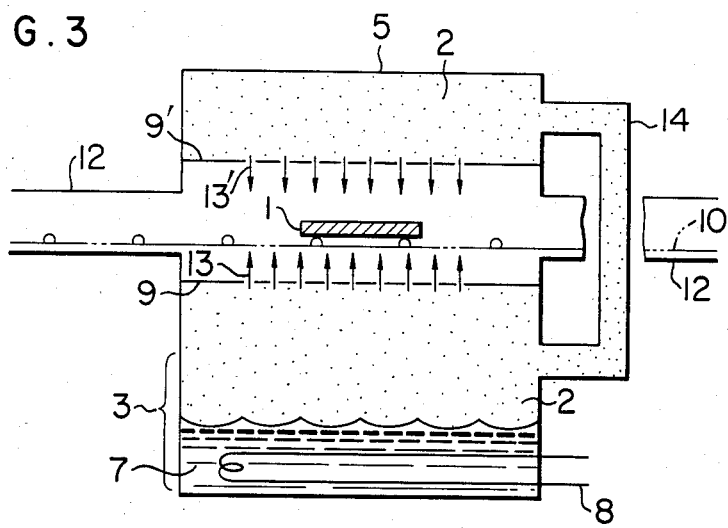
FIG. 3 is a schematic vertical sectional view of the vapor tank comprising another embodiment.
Figure 4:
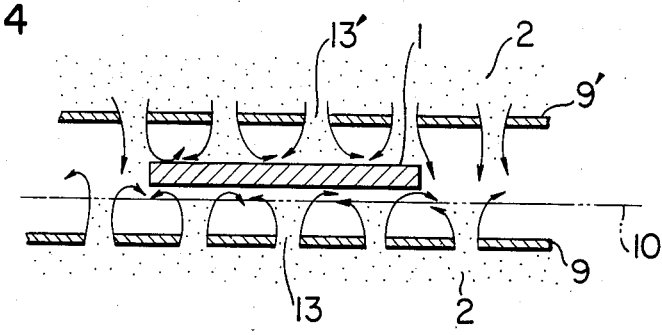
FIG. 4 is a schematic view showing the manner in which the vapor is injected through the openings formed in the partition plate into the processing zone in the vapor tank shown in FIG. 3.

FIG. 3 shows another embodiment of the vapor tank in conformity with the invention in which the vapor is caused to impinge against the product 1 at its top and bottom surfaces. This type of vapor tank has particular utility in applications wherein the product 1 to be processed has a large height and it is impossible to form a vapor film both on its top surface and on its bottom surface to envelop it by the vapor film on all sides merely by injecting the vapor 2 into the processing zone from below. The vapor tank according to the embodiment is provided by additionally mounting a second or upper partition plate 9', and a vapor passage 14 to the vapor tank 5 shown in FIG. 1. The partition plate 9' is formed with openings 13' as is the case with the partition plate 9 and divides a vapor generating zone from a processing zone in a region of the tank 5 above the product 1 to be processed. The vapor passage 14 comprises a pipe through which the vapor 2 produced in the vapor generating section 3 is introduced into a vapor chamber defined by the partition plate 9' and walls of the vapor tank 5. The vapor 2 produced in the vapor generating section 3 flows upwardly through the openings 13 formed in the partition plate 9 to be injected therethrough into the processing zone where it impinges against the product 1 and is led, at the same time, through the vapor passage 14 to the vapor chamber in an upper portion of the vapor tank 5. From the vapor chamber, the vapor 2 flows downwardly to be injected through the openings 13' into the processing zone where it impinges against the top surface of the product 1. Although the vapor passage 14 is provided to introduce the vapor 2 from the vapor generating section 3 in the lower portion of the vapor tank 5 to the vapor chamber in the upper portion of the vapor tank 5, this construction is not essential to the embodiment shown in FIG. 3, and an additional vapor generating section may be provided to the upper portion of the vapor tank 5 while the vapor passage 14 is done without, so that the upper and lower vapor chambers will be filled with vapor produced by the separate vapor generating sections FIG. 4 shows the manner in which the vapor 2 is injected into the processing zone from above and below the product 1 to envelop the same by saturated vapor.

When the vapor 2 in the vapor tank 5 has high specific gravity with respect to air, almost all the vapor 2 is injected through the openings 13 into the processing zone and the vapor led through the vapor passage 14 into the vapor chamber in the upper portion of the vapor tank 5 tends to become small in amount, if the diameter of the openings 13 is too large. When this is the case, it is necessary to render the diameter of the openings 13 smaller than that of the openings 13' to increase the amount of the vapor 2 injected through the openings 13' into the processing zone. Also, when the vapor 2 has high specific gravity with respect to air, the vapor 2 tends to fall by its own weight through the openings 13' rather than being injected therethrough by vapor pressure. This makes it necessary to increase the diameter of those openings 13' which are remote from the vapor passage 14 while decreasing the diameter of those openings 13' which are near the vapor passage 14, so that the vapor 2 will be uniformly directed against the product 1. By this arrangement, it is possible to raise the temperature of the product 1 or to increase the heat transfer area of the product 1 and process the top surface thereof by exposure to the vapor 2 serving as a heating medium, even if the product 1 to be processed has a large height.

Figure 5:
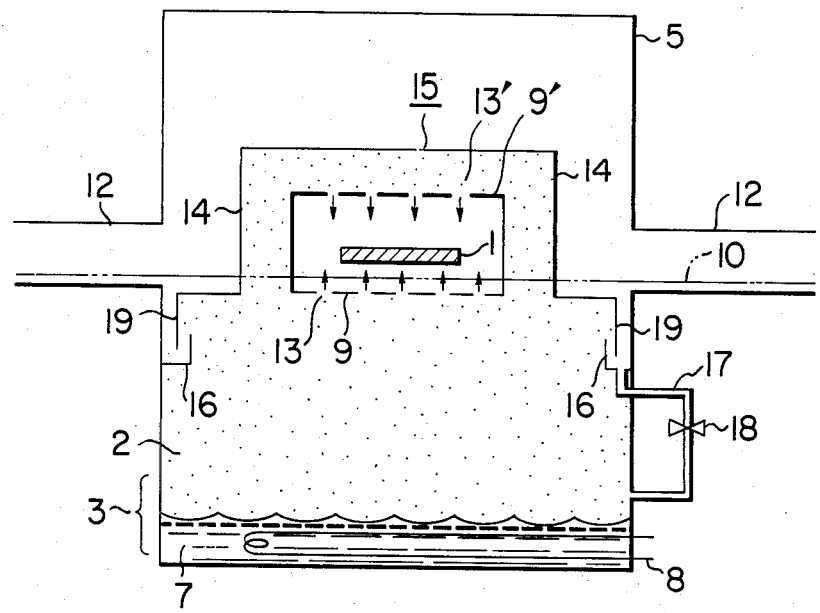
FIG. 5 is a schematic vertical sectional view of the vapor tank comprising still another embodiment.

FIG. 5 is a schematic vertical sectional view of the vapor tank comprising another embodiment which is capable of producing saturated vapor. The vapor tank 5 includes a case 15 which is a vessel having a partition plate 9 in a lower portion thereof, and a vapor chamber located in an upper portion thereof which is maintained in communication with the lower portion via four vapor passages 14. The partition plate 9 is formed with openings 13, and another partition plate 9' is located in a lower portion of the vapor chamber and formed with openings 13' Two of the four vapor passages 14 are located on either side of the conveyor 10 and serve as posts for supporting the vapor chamber in the upper portion of the case 15 which is rectangular in shape as viewed from above. The side walls of the tank 5 are formed with drains 16 each supporting the lower edge 19 of the case 15 on each of four sides thereof and receiving the fluid in a liquid state which flows down along walls of the case 15 after being produced by the condensation of the vapor 2. A pipe 17 for draining the fluid 7 accumulated in the drains 16 opens in one position in the drains 16 and has a valve 18 mounted therein for opening and closing the pipe 17. As the case 15 is placed in position on the drains 16, the vapor generating zone (first space) of the vapor tank 5 is separated from the processing zone (second space) thereof by the case 15 and they are maintained in communication with each other only through the openings 13 formed in the partition plate 9, the openings 13' formed in the partition plate 9' and gaps defined between the lower edges 19 of the case 15 and the drains 16.

Operation of the embodiment of the vapor tank in conformity with the invention shown in FIG. 5 will be described. Let us first describe the operation of subjecting to processing by exposure to the vapor 2 a product 1 which is relatively small in height and can be satisfactorily processed by the vapor 2 injected through the openings 13 into the processing zone. In this case, the valve 18 is opened and the vapor generating section 3 produces vapor 2. The vapor 2 thus produced flows through the openings 13 and the gaps defined by the lower edges 19 of the case 15 and the grooves 16, and the fluid 7 in a liquid state flowing downwardly along the walls of the case 15 is introduced via the grooves 16 to the pipe 17. With the valve 18 open, the fluid 7 returns to the vapor generating section 3 via the pipe 17, and the gaps remain open. This keeps the vapor 2 from flowing upwardly via the vapor passages 14 to the vapor chamber in the upper portion of the case 15, so that almost no vapor 2 is injected through the openings 13' into the processing zone. Thus, the majority of the vapor 2 is injected through the openings 13 into the processing zone and impinges against the product 1. When the product 1 to be processed is large in height, the vapor 2 is injected through the openings 13' in addition to the openings 13. More specifically, the valve 18 is closed and the vapor generating section 3 produces vapor 2. In initial stages of this operation, the vapor 2 is injected through the gaps defined by the lower edge 19 of the case 15 and the drains 19. However, as the fluid 7 in a liquid state flowing downwardly along the walls of the case 15 collects in the drains 16, the gaps are filled with the fluid 7 which provides a liquid seal to the gaps to prevent the vapor 2 from being injected therethrough. Thus, the vapor 2 is injected only through the openings 13 and 13' into the processing zone, so that the vapor 2 impinges against the top and bottom surfaces of the product 1 to expose the same to a vapor film which envelops the same.

Different constructional forms of the recovery device for recovering used vapor will now be described.

Figure 6:
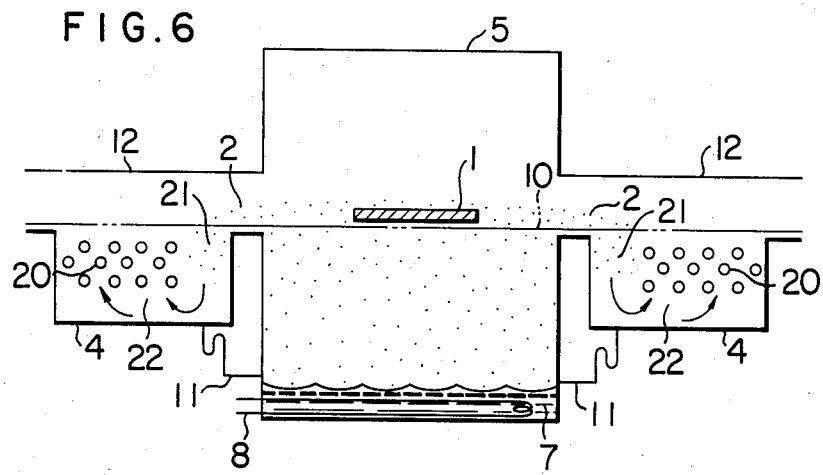
FIG. 6 is a schematic vertical sectional view of the vapor tank comprising still another embodiment, provided with means for recovering the used vapor.

FIG. 6 is a schematic vertical sectional view of the vapor tank 5 according to the invention provided with one constitutional form of recovery device for recovering used vapor. The recovery device comprises condensers 4 located below the inlet and outlet passages 12 and each including a group of cooling tubes 20 for cooling the vapor 2 flowing out of the vapor tank 5 and liquefying the same into the fluid 7 in a liquid state which is returned via communication tubes 11 to the lower portion of the vapor tank 5.

An open space 21 is formed in each of the condensers 4 in a portion thereof close to the vapor tank 5, and another open space 22 is formed in each of the condensers 4 near a bottom wall. The spaces 21 and 22 are three-dimensional spaces having no cooling tubes 20 located therein.

In operation, the vapor 2 flowing from the vapor tank 5 to the inlet and outlet passages 12 falls into the open space 21 because it is heavier than air. In the open space 21, the vapor 2 flows downwardly to be stored in the space 22. The vapor 2 stored in the space 22 is cooled by the cooling tubes 20 in the lower portion of each condenser 4 into a liquid state. Since the vapor pressure is thus reduced in each condenser 4, the vapor 2 flowing into the passages 12 successively falls into the open space 21 and then the space 22, and the vapor 2 cooled and condensed by the cooling tubes 20 is changed to a condensate of a temperature substantially equal to the boiling point of the fluid 7, which is returned through the communication tubes 11 to the lower portion of the vapor tank 5, where it is revaporized. Thus, the energy necessary for heating the condensate by the heaters 8 can be provided only by the latent heat of evaporation, thereby enabling the energy corresponding to the sensible heat to be saved.

The vapor 2 stored in the space 22 of each condenser 4 and flowing from the cooling tubes 20 in the lower portion of the condenser to those in the upper portion thereof is successively cooled as it flows upwardly along the cooling tubes 20 in the condenser 4. Thus, in the condenser 4 of the invention, the vapor concentration decreases as the vapor approaches near an open end thereof which is not the case with a condenser of the prior art. This is conducive to improved efficiency in recovering used vapor.

Figure 7:
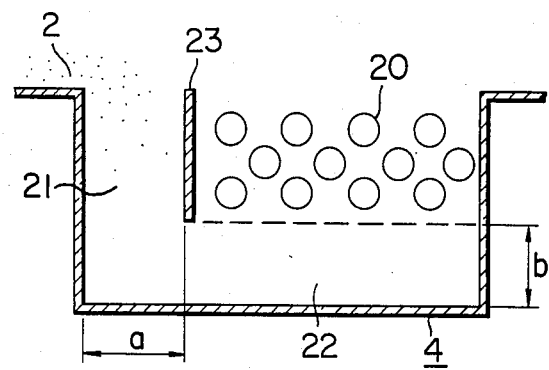
FIG. 7 is a fragmentary vertical sectional view of the vapor tank shown in FIG. 6, showing a modification of the means for recovering the used vapor shown in FIG. 6.

FIG. 7 shows a modification of the recovery device shown in FIG. 6 in which a partition plate 23 is located between the space 21 and cooling tubes 20 in each condenser 4. The provision of the partition plate 23 ensures that the vapor 2 positively flows downwardly in the space 21 without branching off toward the cooling tubes 20, thereby increasing the used vapor recovering efficiency. In the modification shown in FIG. 7, a dimension a of the space 21 in each condenser 4 oriented in the direction of movement of the product 1 to be processed may be decided based on the specific gravity of the vapor 2 with respect to air and the vapor pressure thereof. Generally, the dimension a may be small when the specific gravity of the vapor 2 with respect to air is high, because the vapor having a high specific gravity with respect to air shows a marked tendency to fall downwardly along inner wall surfaces of the condenser. The depth b of the space 22 in each condenser 4 may be decided based on the volume of the vapor 2 flowing into each condenser 4 per unit time and the capacity of the cooling tubes 20 to cool the vapor 2.

Experiments were conducted to compare the temperature of the condensate flowing through the communication tubes 11 when the condenser 4 according to the invention was used with the temperature of the condensate flowing through the communication tubes when a condenser of the prior art was used. The results show that there is a difference of about 30° C. between the two condensates.

The use of the condensers 4 according to the invention as a device for recovering the used vapor makes it possible to clearly define a saturated vapor region and an air region in each passage 12. More specifically, the vapor 2 flowing out of the vapor tank 5 flows into the space 21 of each condenser 4, so that the amount of the vapor 2 flowing horizontally along each passage 12 is reduced and the vapor pressure is markedly reduced in a portion of each passage 12 which is located outside the space 21. Thus, the product 1 to be processed passes through an unsaturated vapor zone before its temperature falls, with a result that the vapor 2 is prevented from forming frost on the surface of the product 1, making it possible to recover nearly all the used vapor which is expensive without being wasted.

Figure 8:
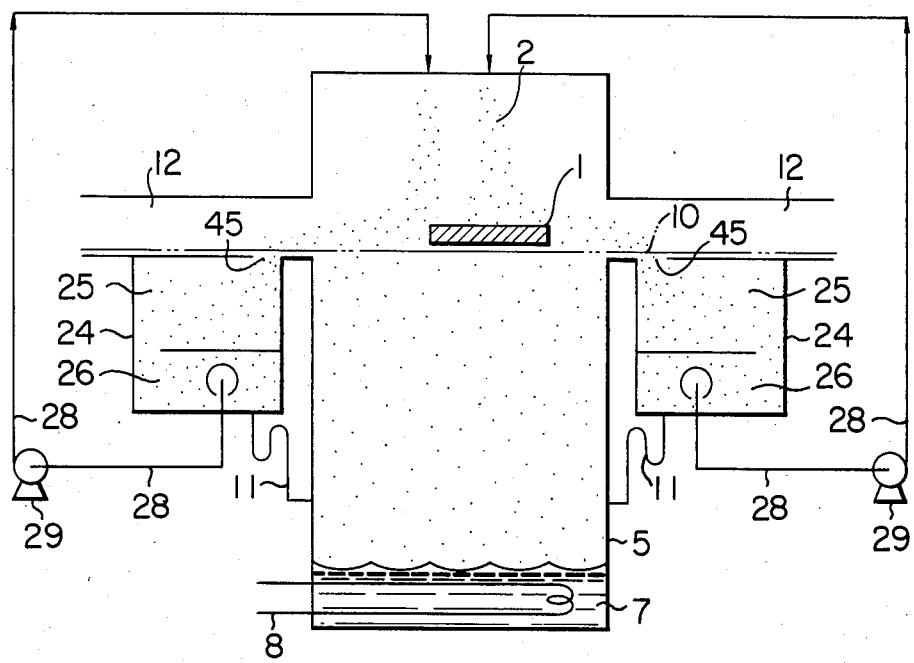
FIG. 8 is a schematic vertical sectional view of the vapor tank comprising still another embodiment, provided with another form of means for recovering the used vapor.

Another constructional form of the recovery device according to the invention will be described by referring to FIG. 8 which is a schematic vertical sectional view of a vapor phase system incorporating therein the vapor tank according to the invention. In FIG. 8, the condensers 4 shown in FIG. 6 are replaced by vapor boxes 24. The vapor boxes 24 are each disposed close to the vapor tank 5 and formed with an opening 45 for allowing the vapor 2 to flow therethrough into the respective vapor box 24 including a space 25 for separating air from the vapor 2, and a space 26 for storing the vapor 2. Since the specific gravity of the vapor 2 is higher than that of air, the vapor 2 is separated from air as it gradually falls by gravity in each vapor box 24. Thus, the vapor 2 in the upper space 25 is in an unsaturated state in which the vapor 2 mingles with air, and the vapor 2 in the lower space 26 is in a saturated state. An air phase prevails above the upper space 25. The vapor 2 separated from air and collecting in the lower space 26 of each vapor box 24 is returned to the vapor tank via a communication tube 28 connected to a blower 29. The vapor boxes 24 are not designed to positively cool the vapor 2 and liquefy the same into a condensate, to recover the used vapor, but intended to obtain condensation of the vapor by dissipating heat to outside in an effort to return the vapor 2 to the vapor tank 5 in the state of a nearly perfect vapor. The recovery device shown in FIG. 8 is capable of achieving the recovery of vapor by increasing thermal efficiency substantially two fold as compared with a vapor recovery device of the prior art. Although it is very small in amount, some of the vapor is cooled and liquefied as it is allowed to condense by heat dissipation to outside. The vapor thus liquefied is returned to the vapor tank 5 via the communication tubes 11.

Figure 9:
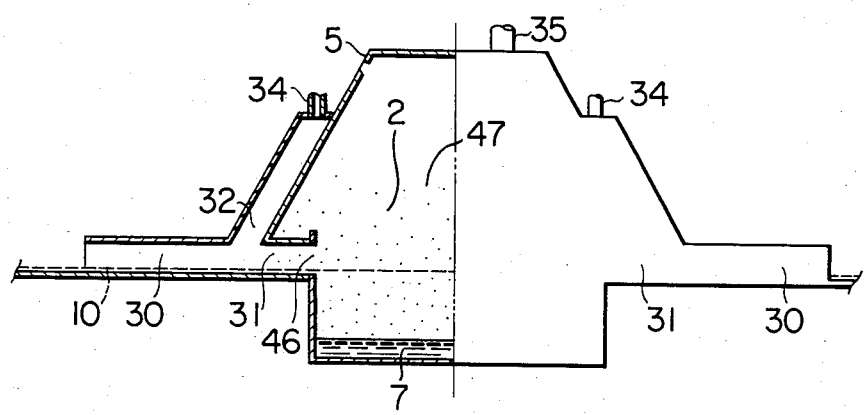
FIG. 9 is a side view of vapor tank comprising still another embodiment provided with means for preventing the escape of the vapor from the vapor tank.

FIG. 9 is a side view of the vapor tank 5 comprising still another embodiment of the invention equipped with another constructional form of the recovery device in the form of a mechanism for avoiding leaks of vapor to outside from the tank 5. In FIG. 9 in which the left half portion of the vapor tank 5 is shown in a vertical sectional view, the fluid 7 is heated to generate the vapor 2. The vapor tank 5 has an exhaust port 35 serving as a nozzle for releasing gas from the tank 5 to outside, and an inlet or outlet 46 serving as a boundary between the inside of the tank 5 and the outside thereof. The conveyor 10 is loaded with the product to be processed and moves through the vapor tank 5 for introducing and discharging the product into and out of the vapor tank 5. A tunnel 30 serves as a passage through which the product is introduced into the tank 5 and discharged therefrom and also as a path of currents of air as subsequently to be described. A tunnel 31 constitutes an extension of the tunnel 30 and serves as a passage for introducing the product into the tank 5. A tunnel 32 which branches from the tunnel 30 at the boundary between the two tunnels 30 and 31 extends obliquely upwardly of these tunnels 30 and 31 from the upper walls of these tunnels 30 and 31 and serves as a passage for the currents of air flowing through the tunnel 30. Exhaust ports 34 serve as nozzles for releasing the air currents to outside.

In operation, as the fluid 7 is heated to generate the vapor 2, the vapor 2 rises to a certain elevation inside the vapor tank 5, and an interface 47 is formed between an air phase above it and the vapor phase below it. Meanwhile, a portion of the vapor 2 flows out of the tank 5 via the inlet or outlet 46 and tunnels 31 to outside. If currents of air having a momentum higher than the momentum of the vapor escaping from the tank 5 were created in the tunnels 30, such air currents would flow through the tunnels 32 to be released to outside through the exhaust ports 34. Thus, the vapor 2 flowing out of the tank 5 to the tunnels 31 would be forced by the air currents in the tunnel 30 to flow back into the tank 5, thereby preventing the vapor 2 escaping from the tank 5.

To form in the tunnel 30 an air current which is uniform in density in the direction of flow would only require the provision to the tunnel 30 of a length which is over three times as great as its height. The tunnels 32 each extend obliquely upwardly toward the upper portion of the vapor tank 5 to enable the air current to smoothly flow upwardly after flowing through the tunnel 30. This is necessary because the vapor 2 in the tunnel 31 would be drawn into a vortical flow of air if one were produced at the boundary between the tunnels 30 and 32. The air currents are led to flow upwardly through the tunnels 32 in order to allow the vapor 2 having a higher specific gravity with respect to air to collect in the tunnels 31.

To seal the vapor 2 completely in the tunnels 31, the air currents flowing through the tunnels 30 preferably have a greater kinetic energy than the vapor 2 flowing out of the tank 5 via the inlet and outlet 46 into the tunnels 31. More specifically, the formula $V_2 > V_1 \times \sqrt{a}$ preferably exists where $a$, $V_1$ and $V_2$ are the specific gravity of the vapor with respect to the air, the mean flow velocity of the vapor flowing out of the tank 5 and the mean flow velocity of the air, respectively.

In each of the tunnels 31, the pressure at which the vapor 2 flows out of the tank 5 through the inlet or outlet 46 would fall if the pressure prevailing in the upper portion of the vapor tank 5 were made lower than the pressure prevailing in each of the tunnels 32 so as to render the pressure of air equal to the pressure of vapor at the inlet or outlet 46. Thus, an interface extending obliquely between the air phase and vapor phase is formed in each tunnel 31, thereby greatly reducing the amount of vapor escaping from the vapor tank via the inlet or outlet 46.

Preferably, the tunnels 30 and 31 are gently sloping toward the vapor tank 5 to facilitate the flow of a condensate toward the vapor tank 5.

Figure 10:
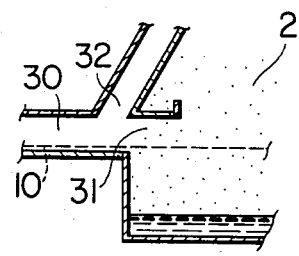
FIG. 10 is a fragmentary vertical sectional view of the vapor tank provided with a modification of the means for preventing the escape of the vapor from the vapor tank shown in FIG. 9.
Figure 11:
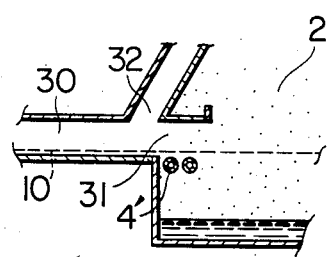
FIG. 11 is a fragmentary vertical sectional view of the vapor tank shown in FIG. 10, shown as being provided with a condenser.

FIG. 10 shows a modification of the embodiment shown in FIG. 9 in which the tunnels 31 has no bottom, and FIG. 11 shows a condenser 4' mounted to the bottom of the tunnel 31 to allow a downwardly directed current of vapor to be produced locally.

Figure 12:
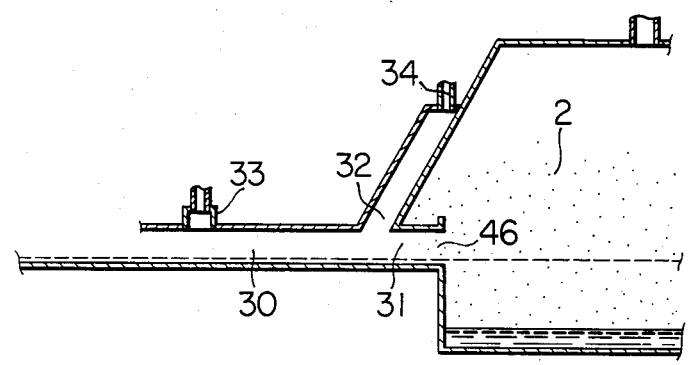
FIG. 12 is a fragmentary vertical sectional view of the vapor tank shown in FIG. 9, showing in detail the suction port in the upper portion of the tunnel.
Figure 13:
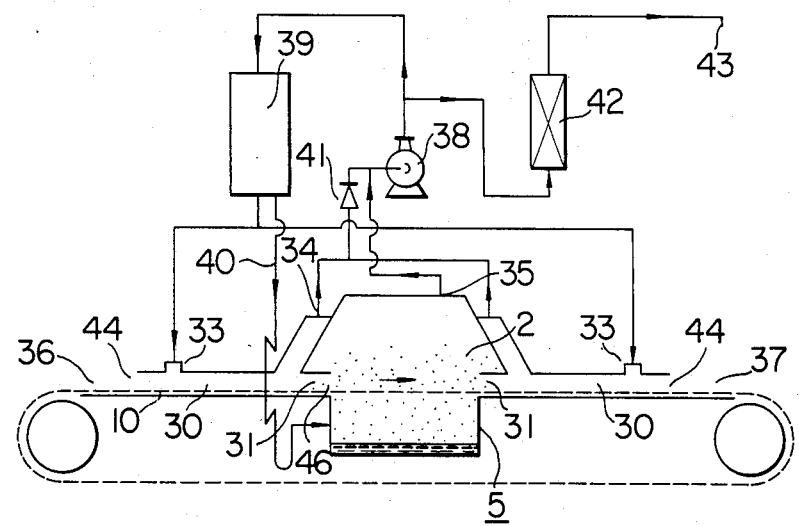
FIG. 13 is systematic view of the vapor phase system including the vapor tank according to the invention provided with means for preventing the escape of the vapor from the vapor tank.

FIGS. 12 and 13 show a vapor phase system suitable for performing a vapor phase process incorporating therein the vapor tank according to the invention.

FIG. 13 is a systematic view of the vapor phase system including the vapor tank 5, and the endless belt conveyor 10 moving through the vapor tank 5. The product to be processed is loaded onto the belt conveyor 10 at a left end 36 and moved through the vapor tank 5 to be processed by exposure to the vapor at high temperature, before being removed from the conveyor 10 at a right end 37 thereof.

The tunnels 30 are evacuated by means of a blower 38, and the vapor mingling in the air removed from the tunnels 30 is recovered by a recovery device 39, although it is small in amount, and the refreshed air is circulated to a suction port 33 located at an upper portion of a wall of each tunnel 30. FIG. 12 is a vertical sectional view of the suction port 33, and the numeral 41 in FIG. 13 designates a fluid resistor arranged in a tube. The provision of the resistor 41 for offering resistance to a current of vapor flowing therethrough renders the internal pressure of the vapor tank 5 in an upper portion thereof lower than the internal pressure of the tunnels 32 to enable the pressures at inlet and outlet 46 to be equalized.

The vapor recovered in a liquid state by the recovery device 39 is returned to the vapor tank 5 via a tube 40.

A portion of the air released from the blower 38 is branched and exhausted from the system to outside via noxious gas removing means 42. The purpose of exhausting the portion of air is to form an inwardly directed minuscule air current at an outer end 44 of each tunnel 30 and to avoid accumulation in the system of gases produced by decomposition of the vapor in the vapor tank 5.

The recovery device 39 may comprise a combination of a fin-tube condenser and a demister, and the noxious gas removing means 42 may comprise an adsorption tower or an absorption tower.

By causing the air to circulate as shown in FIG. 13, it is possible to recover the vapor by the recovery device 39 which might escape from the vapor tank 5 and mingle with the air in the tunnels 30 to be released from the tunnels 31 via the exhaust ports 34. It is also possible to avoid inflow of a large amount of air into the vapor tank 5 from outside, thereby enabling the vapor in the tank 5 to be maintained in a clean state. The circulating air current causes a current of hot air to flow through the tunnels 30, making it possible to preheat the product to be processed and to dry the processed product by utilizing the hot air current.

Generally, the vapors used in the vapor tanks of vapor phase systems are noxious and expensive. The vapor tank 5 according to the invention is capable of avoiding leaks of the vapor 2 to outside from the tank 5. Even if the vapor 2 escapes from the tank 5, the leaks are small in amount and almost all the escaped vapor can be recovered.

The effects achieved by the invention will be summarized as follows:

(a) The vapor tank constructed according to the invention is capable of economically supplying saturated vapor in an amount high enough to process the product satisfactorily by a saturated vapor process;

(b) The vapor tank according to the invention is low in energy loss, because it is provided with escaped vapor recovery means of high efficiency; and (c) The vapor tank according to the invention is capable of effectively avoiding leaks of the vapor from the vapor tank.

What is claimed is:

1. A vapor tank for processing a product by heating the same through exposure to vapor, comprising:
   a vapor chamber located in a lower portion of the tank and filled with vapor;
   a heating chamber for processing the product by heating the same;

means for supporting the product during processing; and a partition wall separating the heating chamber and the vapor chamber from each other and formed with openings of a dimension providing jet currents of saturated vapor in the vapor chamber therethrough from the lower portion of the tank toward the heating chamber, the jet currents impinging against the product located in the heating chamber to cooperatively envelop the product with the saturated vapor.

2. A vapor tank as claimed in claim 1, further comprising a second vapor chamber located in an upper portion of the tank, said second vapor chamber and lower vapor chamber being maintained in communication with each other through a vapor passage to enable the vapor to be commonly supplied to the two vapor chambers, and a second partition wall separating the heating chamber and the second vapor chamber from each other and formed with openings for allowing the vapor in the second vapor chamber to to flow downwardly therethrough from the upper portion of the tank toward the heating chamber, the downward flow impinging against the product located in the heating chamber to collectively reinforce said vapor substantially from above.

3. A vapor tank as claimed in claim 2, wherein the openings formed in the upper second partition wall have a mean area greater than the mean area of the openings formed in the lower first partition wall.

4. A vapor tank as claimed in claim 2, wherein the vapor flow inside said second vapor chamber is provided from a portion thereof close to said vapor passage toward a portion thereof far from the vapor passage in a direction along said second partition wall, the area of the openings formed in said second partition wall being larger in the openings located in said far portion of the second partition wall than in the openings located in said close portion thereof.

5. A vapor tank as claimed in claim 2, wherein said lower partition wall is formed in a portion thereof with adjustable exhaust means whereby when the exhaust means is opened, the vapor is mainly injected through the openings formed in the lower partition wall and when the exhaust means is closed, the vapor is injected both through the openings formed in the lower partition wall and through the openings formed in the upper partition wall.

6. A vapor tank for processing a product by heating the same through exposure to vapor, comprising:

recovery means located beneath a passage through which the product is brought into and out of the vapor tank for recovering the vapor of high specific gravity with respect to air by cooling the vapor with a group of cooling tubes;

said recovery means including a first space disposed in the vicinity of the vapor tank for allowing the vapor flowing out of the tank to flow downwardly, and a second space disposed in the vicinity of a bottom portion thereof for collecting the vapor that has flowed downwardly, said group of cooling tubes being located above the second space for cooling the vapor;

wherein said recovery means includes a partition plate located between said first space and said group of cooling tubes for partitioning the former from the latter to prevent the vapor from flowing directly from the first space toward the group of cooling tubes.

7. A vapor tank for processing a product by heating the same through exposure to vapor, comprising:

a first tunnel extending substantially horizontally and providing an inlet and an outlet for introducing and discharging the product into and out of the vapor tank, a second tunnel branching from an upper portion of the first tunnel and extending therefrom obliquely upwardly toward the vapor tank, and means for supplying air directed to flow from the first tunnel toward the second tunnel to prevent the vapor in the vapor tank from flowing into the first tunnel.

* * * * *